United States Patent [19]

DeSanto

[11] Patent Number: 4,728,885
[45] Date of Patent: Mar. 1, 1988

[54] METHOD AND APPARATUS FOR DUPLICATING ELECTRICAL ENVIRONMENTAL CONDITIONS

[76] Inventor: Joseph J. DeSanto, 14 Hillcrest Rd., Belle Mead, N.J. 08502

[21] Appl. No.: 821,785

[22] Filed: Jan. 23, 1986

[51] Int. Cl.$^4$ ............................................. G01R 13/06
[52] U.S. Cl. .................................... 324/102; 324/112; 324/113; 364/481
[58] Field of Search ...................... 324/73 R, 102, 111, 324/112, 113; 364/481, 483

[56] References Cited

U.S. PATENT DOCUMENTS

| | | | |
|---|---|---|---|
| 2,521,623 | 9/1950 | Arndt, Jr. et al. | 324/112 X |
| 3,551,891 | 12/1970 | Hermes et al. | 324/113 X |
| 3,551,893 | 12/1970 | Mehnert et al. | 324/112 X |
| 3,719,812 | 3/1973 | Bishop et al. | 324/73 R X |
| 4,105,966 | 8/1978 | Lennon et al. | 324/113 |
| 4,110,684 | 8/1978 | Gale | 324/52 |
| 4,290,014 | 9/1981 | Tremaine | 324/77 A |
| 4,514,770 | 4/1985 | Bowden et al. | 360/69 |

FOREIGN PATENT DOCUMENTS 2095932 10/1982 United Kingdom ................ 324/113

Primary Examiner—Reinhard J. Eisenzopf
Assistant Examiner—Stephen M. Baker
Attorney, Agent, or Firm—Richard C. Woodbridge

[57] ABSTRACT

A monitoring system and apparatus is employed to duplicate unique environmental conditions at a first location so that sensitive electronic devices can be tested at a second location. Initially an environment recorder is plugged into the AC line at the first location. Line voltage characteristics including transients are then captured on tape. The environment recorder has the ability to record and respond only to unusual environmental conditions. The tape of the environment recorder is subsequently removed to a second location, typically the manufacturer's laboratory, where it is played back through the same or another environmental recorder into a reproduction line driver. Output voltages produced by the reproduction line driver exactly mimic the environmental conditions at the first location. The duplicated output is fed into the sensitive electronic device which might be a computer or other sensitive instrument to see how it responds to the simulated electronic conditions from the first location. In this manner a manufacturer can safely test and analyze sensitive electronic equipment in the laboratory rather than at a remote customer location. The invention permits the user to selectively record and save electrical events that occur at random thereby conserving recording tape and valuable laboratory testing time.

19 Claims, 3 Drawing Figures

METHOD AND APPARATUS FOR DUPLICATING ELECTRICAL ENVIRONMENTAL CONDITIONS

BACKGROUND OF THE INVENTION

1. Field of the Invention

The invention relates to a method and apparatus for recording randomly occurring electrical environmental conditions at a first location and then exactly duplicating those electrical environmental conditions at a second location so that electronic instruments and the like can be tested under simulated conditions that are virtually identical to the electrical conditions at the first location.

2. Description of the Prior Art

A significant need exists for instruments that can precisely record electrical environmental conditions at a first location and then identically duplicate those electrical environmental conditions at a second location so that sensitive electronic instruments can be tested and monitored under close observation. At present there exist devices that will record electrical conditions and then analyze those conditions to detect power faults or low voltage problems. See for example, U.S. Pat. No. 4,110,684. Of similar interest are U.S. Pat. Nos. 2,521,623; 4,105,966 and 4,290,014.

The seismographic art has relied for years on the ability to monitor and record conditions at one location and then remove the recordings to a second location so that the output can be analyzed. See, for example, the teachings in U.S. Pat. No. 4,514,770. However, seismic systems are not used to duplicate electrical conditions at a second location, nor is their purpose to assist in the testing and checking of sensitive electronic devices.

Insofar as understood none of the prior art or any combination thereof teaches or suggests a method or apparatus of monitoring electrical conditions at one location and then exactly reproducing those conditions at a second location so that an electronic instrument can be tested in a simulated real time environment.

SUMMARY OF THE INVENTION

Briefly described the invention comprises a method and apparatus for simulating environmental conditions taken from a first remote location and then duplicating those conditions at a second location. Initially an environmental recorder is plugged into the AC line of a first remote location. The remote location might, for example, be in the plant or laboratory of a customer who is in the market to purchase a sensitive electronic device. Such a device might include, but not be limited to, personal computers, electronic analytical instruments, etc. The environmental recorder has the capability of precisely recording unique transient conditions that have the potential of damaging or interrupting the customer's sensitive electronic device. Subsequently, the tape from the environmental recorder is removed to a second location, typically a manufacturer's laboratory or test site. Under controlled conditions the same or another environment recorder plays the tape and the output feeds into a preamplifier and a power line amplifier and from then into an output box. A delicate instrument is then plugged into the output box and subjected to simulated electronic conditions virtually identical to those recorded at the customer's location. In this manner the electronic equipment can be tested under the same identical conditions as are found at the customer's site without having to take the electronic equipment to the customer's site. If the sensitive electronic device fails under the simulated electronic conditions of the customers site, then it is possible to analyze the characteristics of the recorded electrical conditions to determine precisely what it was that caused the sensitive electronic device to fail. Therefore, a manufacturer can anticipate the problems unique to a customer's site and make corrections to the sensitive electrical instrument prior to installation. For example, the manufacturer may wish to increase the filter capabilities or the power delivery capabilities of the sensitive electrical device's power supply. Considerable savings of time and money are achievable because time is not wasted taking the device to the customer's site and because the sensitive electronic device is not damaged at the customer's site. These and other features of the invention will be more fully understood by reference to the following figures which describe the invention.

DETAILED DESCRIPTION OF THE INVENTION

During the course of this description the same numbers will be used to indicate like elements according to the different views that illustrate the invention.

The general purpose of the invention is to prerecord an electrical event on an AC line, look at it using a high speed analog-to-digital converter and then process the data using a high speed microprocessor. If any anomolies are detected by the software in the microprocessor, then a tape record of the event is made which is to be used later with a reproduction line driver. This permits the system to record line disturbance events occuring over a period of many hours on a tape which might have less than one hour playing time on it. The reproduction line driver reproduces the electrical conditions so that an accurate version of the original electrical environment can be duplicated in a research or testing laboratory.

Figure 1:
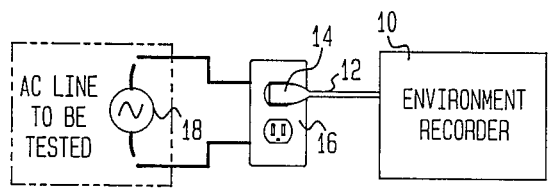
FIG. 1 shows the environment recorder according to the preferred embodiment of the invention connected to the AC power line at a first location where the electrical conditions are uncontrolled.

FIG. 1 shows a preferred embodiment of the invention at a first location. The location might be that of a customer who has relatively uncontrolled electrical conditions. An environment recorder 10 is connected by a cord 12 and a plug 14 to a power receptacle 16. An uncontrolled source of AC power 18 is connected to receptacle 16. Environment recorder 10 records the anomolies and the unique characteristics of the AC source 18 for subsequent playback. The details of environment recorder 10 are shown in greater specificity in FIG. 3. The customer at the first uncontrolled location might be the potential purchaser of a sensitive electronic device 20 such as a personal computer, microprocessor controlled analyzer, etc. The previous technique was to connect the sensitive electronic device 20 directly to the AC outlet 16 at the customer's site. In doing so the manufacturer and customer took a risk that there might be dangerous transients or electrical conditions from AC source 18 that could damage the instrument. According to the present invention, the manufacturer starts by connecting the environment recorder 10 to the AC source 18 and recording the electronic events thereon for a period of time, perhaps as long as 24 hours. Therefore, instead of damaging the sensitive electronic instrument 20 the manufacturer instead merely records the electrical conditions on the AC line for subsequent use at a second controlled location such as a testing or research laboratory.

Figure 2:
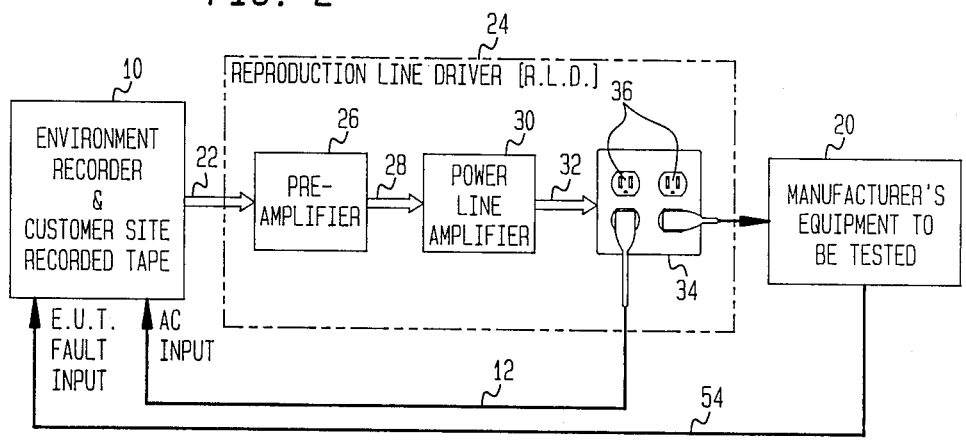
FIG. 2 illustrates the environment recorder in the context of a second controlled location where the output of the system is connected to a sensitive electronic device.

FIG. 2 illustrates the system in the context of a second controlled environment such as a testing or research laboratory at the manufacturer's location. The environment recorder 10 is connected via lines 22 to reproduction line driver (R.L.D.) 24. The manufacturers equipment 20 is connected to reproduction line driver 24 through power outlet plugs 36 and power junction box 34. A power line 12 feeds some of the output back to the environment recorder 10. The reproduction line driver 24 comprises a preamplifier 26 connected via lines 28 to a power line amplifier 30 which in turn is connected via lines 32 to the power output junction box 34 and its associated plug sockets 36. An equipment under test (E.U.T.) fault input line 38 detects when equipment 20 fails and signals that event to environment recorder 10.

The controlled output environment system illustrated in FIG. 2 operates in the following manner. Environment recorder 10 is initially connected via line 22 to the reproduction line driver 24. The manufacturers equipment 20 is connected to the power output plugs 36 and power line 12 is connected between the output plugs 36 and the environment recorder 10. E.U.T fault input line 54 also connects the environmental recorder 10 to the equipment under test 20. Environment recorder 10 then plays out the signals that it had previously recorded in the embodiment illustrated in FIG. 1 into the reproduction line driver 24. The output power at junction box 34 directly mimics and is substantially identical to the power originally monitored from AC line source 18. Therefore the manufacturers equipment 20 is subjected to substantially identical electronic conditions as were originally measured in the first uncontrolled environment of FIG. 1. Preamplifier 26 and power line amplifier 30 are conventional items that are available from electronic supply houses. However, environment recorder 10 is unique and is described in further detail in FIG. 3.

Environment recorder 10 operates in two record modes. The first record mode is the line record mode and the second mode is a tape-to-tape record mode. The AC line may be monitored either through input circuit 40 or input circuit 44. If monitored by input circuit 40 it is first stepped down by transformer 42 and the input that goes into analog switch 50. Alternatively, the AC input can be brought in through circuit 44 in which case it is preconditioned by voltage divider 46 and 48 to approximately 1/16 or 1/17 of its original amplitude. The AC input is preferably applied to input circuit 44. Resistor 46 has a preferred value of approximately 1.6 megohm and resistor 48 has a preferred value of 10 Kohms, thereby producing 1 to 17 reduction in voltage amplitude. The output of input circuit 44 is also applied to analog switch 50. An oscillator/calibrator circuit 52 puts a 400 c.p.s. header normalizing signal on Tape 72 in a manner to be described subsequently. When selected by microprocessor 90 the signal from the analog switch 50 is sent to amplifier 56. Amplifier 56 is a high impedance buffer amplifier. The output of amplifier 56 is fed both to analog switch 68 and the sample and hold portion of the high speed analogto-digital converter circuit 98. When in the line record mode analog switch 68 permits the signal from amplifier 56 to pass to the No. 1 record head 64. Therefore the input signal from AC source 18 will be continuously recorded either through primary input circuit 44 or alternative AC input circuit 40 through record head 64 onto tape recorder 62. At the same time high speed analog-to-digital converter 98 converts small segments of the signal at a conversion rate of 2,000 segments per second or one segment for each 0.5 milisecond. Amplitude readings of the input signal are compared to normalized standard readings stored in EPROM 92 in synchronism with the AC wave source 18 which is detected by zero crossover detector circuit 102. The acceptable limits for the electrical events are programmed into RAM94 by keyboard 100. Zero crossover detector circuit 102 detects the zero crossings of the AC wave source 18. The output from zero crossover detector 102 forms the input to vector generator 104 the output of which passes to interrupt circuit 112. Therefore the zero crossings of the AC electrical source 18 can be synchronized with normalized standard electrical condition readings stored in EPROM 92 and the actual digitized signal as converted by analog-to-digital converter 98. The operation of microprocessor 90 is controlled in part by standard key pad controls 100 which also sets the error limits in RAM 94. The operations of microprocessor 90 are also controlled by a standard crystal clock 96 and the dynamic memory for the microprocessor 90. Another input source to microprocessor 90 is through equipment under test (E.U.T.) fault circuit 106 which is connected through a photo coupled high impedance switch 108 and a vector generator 110 to interrupt circuit 112 which is shared with zero crossover detector 102. Mirocprocessor 90 computes the basic electrical condition of the AC source 18 and make comparisons to precise corresponding points on a normal AC output. The comparison function permits the calculation of values which give error deviations. Depending upon the threshhold values set in the RAM 94 by the user the information may be directed to a second recorder 72. If the information exceeds a certain set error value in RAM 94 then the second recorder 72 will begin recording. Since the first playback head 66 of the first recorder 62 is continuously tracking in signal time by 3 line cycles, the second recorder 72 will begin its recording approximately 3 line cycles ahead of the detected abnormal electronic condition. Recorder 72 will begin recording at detected zero crossover. This will give smooth transition when playing back. The first recorder 62 comprises an endless tape which in the first line record mode is used primarily for delay. The second recorder 72 is preferably stopped 3 cycles at zero crossover after the last error value detected by microprocessor 90. Microprocessor 90 gives each disruption, that is each occurrence of an electronic value greater than the error value, an individual number and the time value, an individual number and the time value of the occurrence is recorded. Recording on the second recorder 72 always begins and ends at a zero crossing value as detected by zero crossover detector 102 and as interpreted by microprocessor 90. Therefore in the line record mode the first recorder 62 is always recording through record head 64 and playing back a delayed version of the signal through playback head 66. Its purpose in the line record mode is only to delay a picture of the actual electrical condition of the AC source 18. Microprocessor 90 monitors the same conditions as are recorded on the endless tape 62 and causes the second recorder 72 to turn on in time to record the delayed condition captured briefly by endless tape recorder 62. The signals which pass to and from recorder units 62 and 72 are controlled by analog switches 68, 80 and 82. Analog switches 68, 80 and 82 in turn are controlled by decoding device drive 88 which is in turn controlled by the microprocessor 90. Decoding device drive 88 also controls analog switch 50 and auto gain adjust oircuit 86. The output from the first playback head 66 is amplified by amplifier 70 and fed into second record head 78 through analog switch 80. The first recorder section 62 is controlled by microprocessor 90 through its internal start/stop control 60. Similarly, the second recorder 72 is controlled by microprocessor 90 through its internal start/stop control 74. Collectively start/stop controls 60 and 74 and the first and second recorders 62 and 72 respectively comprise the tape recording section 58 of the environment recorder 10.

The second mode for recording with the environment recorder 10 is the tape-to-tape mode. The purpose of this second mode is to establish a test tape for playing into the reproduction line driver 24 illustrated in FIG. 2. The second tape recorder 72 only records those time periods of the input AC signal source 18 whose value exceed specific error values set in RAM 94. Enviromental conditions are continually recorded on the first tape recorder 62 and selectively transferred to the second tape 72. The second tape 72 only records the exact nature of the error conditions and does not record line conditions which are normal. Accordingly, the tape record on the second recorder 72 is considerably compressed and only includes highlights of the conditions from AC source 18 after error anomolies have occurred. The tape in the first recorder 62 is preferably endless and non-removable. Conversely, the tape in the second recorder 72 is preferably removable so tht it can be replaced with a fresh tape or so that it could be removed to a remote location.

According to the preferred embodiment of the invention the environment recorder 10 may be physically removed from the first location at the customer's site as shown in FIG. 1 to a second location, preferably the manufacturers equipment testing site or laboratory, as shown in FIG. 2. The output 22 of the enviroment recorder 10 is then played into the reproduction line driver circuit 24. In this mode the second playback head 76 of the second recorder 72 feeds an output signal through analog switch 82 and amplifier 84 into the reproduction line driver circuit 24. The output of reproduction line driver 24 is monitored by feedback line 12 which is the original input to the environmental recorder Autogain adjust circuit 86 is used in this mode to adjust the output amplitude to match the expected input through use of the calibrator/oscillator circuit 52 which provides a header designation on the test tape 72. Auto- gain adjust circuit 86 is preferably a conventional ladder network connected around the output of conditioning amplifier 84 and is controlled, as previously described by the decoding device drive circuit 88 which in turn is directly controlled by microprocessor 90. Initially the oscillator/calibrator 52 places a 400 c.p.s. signal with a predetermined fixed amplitude on the beginning header of the tape in second tape recorder 72. The amplitude of the 400 c.p.s. header signal is typically 1/16 or 1/17 of the input A.C. signal. That signal is transferred from oscillator/calibrator 52, through analog switch 50, A1 amplifier 56, analog switch 80 and the second recording head 78 to tape 72. After a few seconds the 400 c.p.s. header signal is turned off and the environment recorder starts to selectively record electrical events that exceed the acceptable range as stored in RAM 92. In the playback mode the amplitude of the 400 c.p.s. signal is sensed by microprocessor 90. If the amplitude of the detected 400 c.p.s. header signal is different from the know predetermined amplitude of the original 400 c.p.s. header signal, then the microprocesor 90 signals the auto gain adjust circuit 86 to change the gain of A3 amplifier 84 to normalize the output to reproduction line driver 24. In this manner the output level is always standardized against a known standard at the beginning so that the electrical events captured on the second tape 72 are faithfully reproduced in terms of voltage amplitude.

Since commercial power amplifiers are available to approximately 20 killowatts it is believed that the reproduction line driver 24 will be capable of driving most commercial electronic computers or instruments 20. If it were desired to monitor three phases then the device would probably require three separate environment recorders 10 to monitor each phase and all three could be synchronized to playback into a three phase reproduction line driver 24. If the equipment under test 20 fails during playback, that condition is signaled by E.U.T. fault input line 38 back to environment recorder 10. That signal is fed through photocoupled high impedance switch 108 and vector generator 110 to interrupt circuit 112 of micoprocessor 90. Since first recorder 62 is always on in the playback mode it will capture the event that caused the equipment under test 20 to fail. The microprocessor 90 is programmed to continue transferring the fault causing event for about 2-3 seconds after the equipment under test 20 has stopped functioning. Therefore, the fault causing event is captured both before and after the event has occurred. The equipment manufacturer can then repeat the fault causing event any number of times by playing the first recorder 62. This permits him or her to analyze the event and then play it back into the equipment under test 20 which may have been revised or repaired to survive the fault causing event.

It is important that the signal being played back be continuous. That is to say an electrical event should not be recorded or played back in the middle of the event. If one were to start at a peak point it could produce a false reading. Therefore, the invention 10 has the ability to start recording each significant electrical event at a zero-voltage crossover point. One way to achieve this is to build in a fixed head delay betwen the first recorder 62 and the second recorder 72. The fixed delay can either be an integral of the line cycle rate or can be compensated by microprocessor 90 to start the second recorder 72 at zero crossover points. That is the preferred mode. Alternatively the zero crossover detector circuit 102 through microprocessor 90 can direct analog switch 80 to start recording transfers only at zero crossover points.

Figure 3:
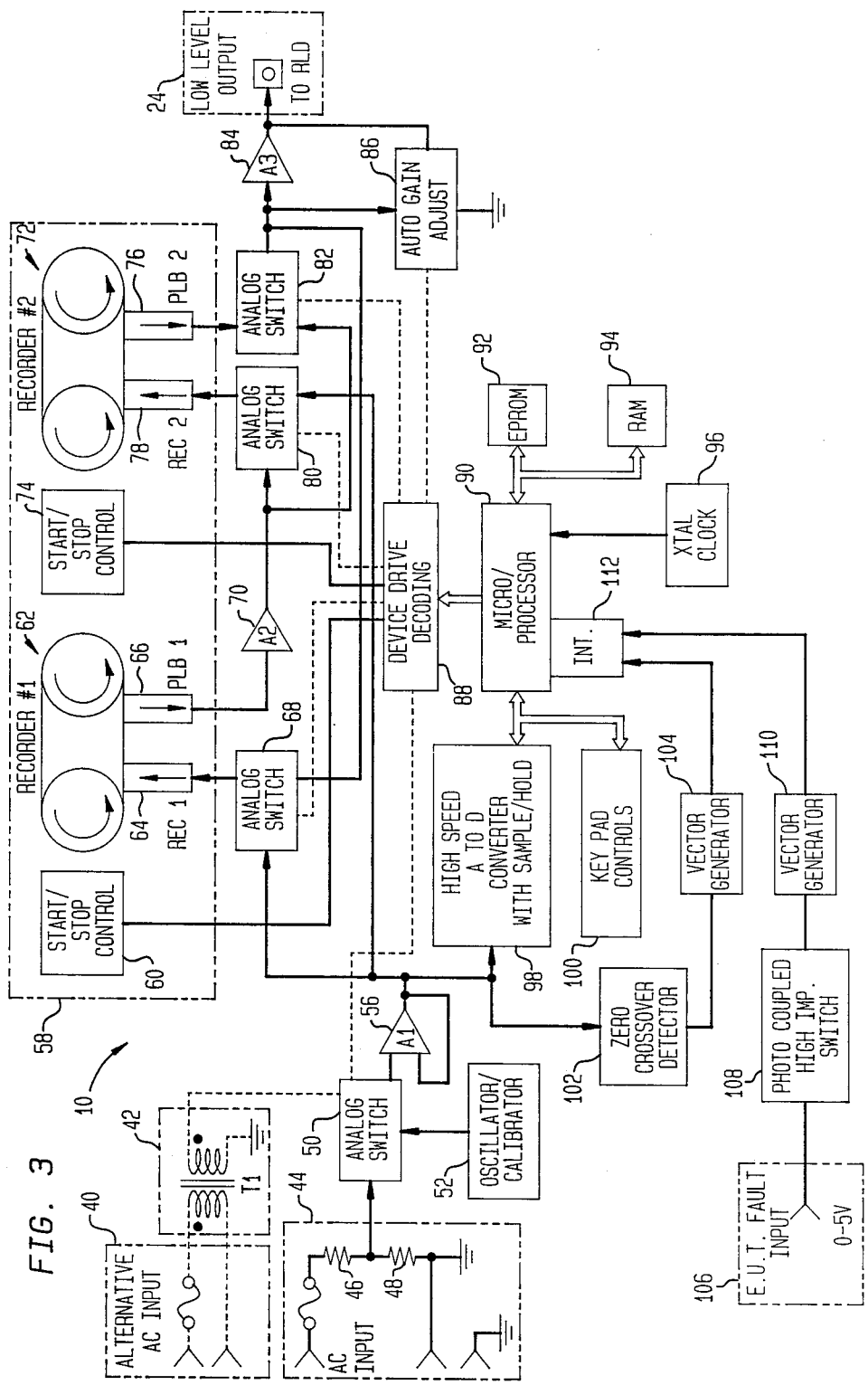
FIG. 3 is a detailed schematic diagram of the environment recorder.

The basic elements of the invention as described in FIGS. 1 through 3 are available from conventional sources. The following comprises a parts list of the major elements of the invention according to the preferred embodiment thereof:

| Element No. | Part Description |
| --- | --- |
| Analog Switches 50, 68, 80 and 82 | Analog Switches RCA CD4052B or CD4053B |
| Amplifiers 56, 70 and 84 | uA725 High Performance Operational Amplifiers or equivalent |
| Transformer T1 | North Hills Electronics Step Down Trans former 16:1 Ratio Type 0800 |
| Oscillator 52 | 10 volt peak to peak, 100 Hz Precision Oscillator - Conover Winfield Sine Wave Model L 220 |
| Zero cross-over Detector 102 | RCA CA-3199T - Zero Cross-Over Detector Package with TTL Output (Also available from most chip manufacturers) |
| Analog to Digital Converter 98 | Datel 12 bit binary converter Model ADC-HY12 RCC High Speed Analog to Digital Converter with Sample and Hold Model No. SHM-LM-2 (also available as integrated unit from other manufacturers) |
| Auto Gain Adjust Circuit 86 | Ladder network for use with 4053 switches to select amplitude gain (available from a variety of manufacturers) |
| Tape Recorders 62 & 72 | Phonemate Model 905 or equivalent answering machine with one continuous loop and one two hour standard cassette tape |
| Preamplifier 26 | uA725 High Performance operational amplifier |
| Power Line Amplifier 30 | California Instruments, 20 Hz-20K cycles, 100 Va-36,000 Va, Model No. 101T for 1 Kra unit |

In summary the device acts in the following manner. The environment recorder 10 is first plugged into an AC line 18 at the customer's location as shown in FIG. 1. Microprocessor 90 then signals analog switches 50 and 80 to pass a 400 c.p.s. normalizing header on second tape recorder 72. The input A.C. voltage is stepped down by a 16 to 1 or 17 to 1 ratio and initially captured on the first endless recording tape 62. At the same time microprocessor 90 analyzes the digital information from the Analog-to-digital converter 98 and compares it with acceptable norms stored in RAM 92. If the signals processed by microprocessor 90 are within normal limits, then nothing happens. The acceptable threshold limits are inputed by keyboard 100 and stored in RAM 94. However, if the signals detected by microprocessor 90 exceed the norms set in RAM 94 by a user set percentage (eg. preferably about 10%) then the second recorder 72 is turned on by device driver 88 so that it will record the specific abnormality temporarily stored on endless tape 62. In this fashion the removable tape in the second recorder 72 makes a compressed and permanent record of the electrical abnormalities temporarily stored on the first recorder 62. After a sufficient period of time has passed, typically 1-24 hours, the tape 72 is removed from the customer's site as shown in FIG. 1 to the manufacturers test laboratory location illustrated in FIG. 2. The output from an environment recorder 10 is connected to the reproduction line driver 24 and the output from the junction box 34 is fed back via line 12 to environment recorder 10 via the AC input circuit 40 or 44. The manufacturers test equipment 20, typically a sensitive electronic computer or instrument, is also connected to the output junction box 34. The electrical signals which appear at sockets 36 are substantially identical in all respects to the electrical signals generated by AC source 18 at the customer's location as illustrated in FIG. 1. In other words, the output signal at sockets 36 is virtually identical in terms of amplitude, current, transient characteristics, harmonics, etc. The only difference between the original AC line source 18 and the power at plugs 36 is that the normal portions of the AC signal have been edited out of the second tape 72 so that only the abnormal, i.e. out of normal range, signals are reproduced at sockets 36. Therefore the manufacturer can test his equipment 20 under virtually identical electrical conditions as existed at the customers site. Not only can the equipment 20 be tested under the same identical conditions, but, it can be tested in a very small fraction of the time it took the original occurence to take place and if the equipment 20 fails, then it is possible for the manufacturer to determine from the tape 72 what the nature of the electrical abnormality was that caused the failure. If the equipment under test 20 fails, that information is signalled to the environment recorder 10 via E.U.T. fault input circuit 106. For the playback mode the first tape recorder 62 is continually on. When a shut down fault is detected at E.U.T. fault input 106 it causes the second recorder 72 to capture the fault causing event on first tape recorder 62. The tester can then replay the fault causing event as many times as desired so that it can be analyzed and/or replayed back into the equipment under test 20 as previously described. The major advantage of the invention is that the manufacturers equipment 20 can be tested under controlled conditions without having to transport it to the customer's location. The potential savings to both the customer and the manufacturer in terms of time, money and damaged equipment is substantial.

In addition, one of the most difficult problems to diagnose and repair is a fault causing event which occurs after long periods of time at random. An oscilloscope generally isn't useful because there is no way to observe the tested device's components when the random event occurs. For example, how can an engineer justify watching an oscilloscope all day for an event that might occur only once every twelve hours? The environment recorder system according to the present invention provides event compression and playback in such a manner as to give the testing engineer a valuable new tool and make his or her job efficient and less tedious. For example, the environment recorder permits the engineer to playback an event at repeated 20 second intervals that might have otherwise occurred at random with a frequency of once every 12 hours.

There are some modifications that can be made to the preferred embodiment of the system that may be useful under certain specific conditions. For example, while the invention has been described with reference to a source of alternating current it is possible that the device could also be used to measure a direct current having a varying or alternating component. Also, the invention has been described in terms of a single phase input, however, two or more phases could be simultaneously monitored by two or more environment recorders 10. The recorders 10 could then be played back in synchronism through one or more reproduction line drivers 24 to drive multiphase equipment 20. Moreover, changes can be made to the system and the recording elements to increase or decrease its sensitivity. For example, tape recorders 62 and 72 can be higher density, higher speed tape units which would record more accurately the electrical subtleties on AC source 18 or they could be low fidelity recorders if all details of the electrical anomaly aren't equally important. It is also possible to change the error ranges in RAM 94 and the sampling rates of the analog-to-digital converter 98 so as to be more or less selective concerning the nature of the electrical anomaly to be captured. Furthermore, recorder 72 could be a multichannel recorder having the automatic capability of providing digital header information for synchronization, self caibration signals and condition numbering and tagging indicia.

While the invention has been described with reference to the preferred embodiment thereof it will be appreciatd by those of ordinary skill in the art that modifications can be made to the components and circuitry of the invention without departing from the spirit and scope thereof.

I claim:

1. A system for duplicating electrical environmental conditions comprising:
    environment recording means for monitoring electrical environmental conditions at a source location and recording said electrical environmental conditions, said environment recording means including:
        a first recording means for temporarily recording said electrical environmental conditions;
        an electrical environmental condition analyzing means for analyzing said electrical environmental conditions substantially at the same time as said first recording means is recording said electrical environmental conditions and for determining when said electrical environmental conditions exceed certain predetermined limits, said electrical envionmental condition analyzing means including a microprocessor means for processing signals representative of said electrical environmental conditions and memory means for storing said predetermined limits; and,
        second recording means connected to said first recording means and to said electrical environmental condition analyzing means for selectively and permanently recording from said first recording means those electrical environmental conditions which exceed said predetermined limits; and,
    reproducing means connectable to said environment recording means for reproducing said electrical environmental conditions,
    wherein an electrical device may be attached to said reproducing means and tested under substantially the same electrical environmental conditions as though said electrical device were at the location of said source of said electrical environmental conditions and wherein said second recording means only records from said first recording means beginning at a predetermined voltage level and ending at the same predetermined voltage level so that the electrical environmental conditions recorded by said second recording means have substantially continuous beginning and ending transitions.

2. The system of claim 1 wherein said analyzing means further includes:
    analog-to-digital converter means for converting said electrical environmental conditions from analog into digital signals and transmitting said signals to said microprocessor means; and,
    zero crossover detector means connected to said microprocessor means for detecting when said electrical environmental conditions pass through a zero voltage level.

3. The system of claim 2 wherein said environment recording means further includes:
    input means connected to said analyzing means for reducing the input voltage of said electrical environmental conditions.

4. The system of claim 3 wherein said environment recording means further includes:
    device drive means connected to said microprocessor means; and,
    switch means connected to said device drive means for causing said second recording means to selectively record from said first recording means.

5. The system of claim 4 wherein said environment recording means further includes:
    output amplifier means connected between said second recording means and the output of said environment recording means; and,
    amplifier gain adjust means connected to said device drive means for adjusting the gain of said output amplifier.

6. The system of claim 5 wherein said environment recording means further includes:
    fault detecting means for monitoring said electrical device to determine when said electrical device fails; and,
    means for transferring the fault causing electrical environmental condition from said second recording means to said first recording means when said fault detecting means detects a fault.

7. The system of claim 6 wherein said first recording means includes an endless tape means and said second recording means includes a removable tape means.

8. The system of claim 7 wherein said reproducing means includes:
    preamplifier means connected to said environment recording means; and,
    power line amplifier means connected to the output of said preamplifier means, the output of said preamplifier means being connectable to said electrical device to be tested.

9. The system of claim 1 wherein said environmental recording means further comprises:
    header means for placing a standardized signal on said second recording means,
    wherein said microprocessor means controls said amplifier gain adjust means so that the signals played back from said second recording means are adjusted in amplitude to substantially duplicate the original electrical environmental conditions.

10. A method for duplicating electrical environmental conditions comprising:
    reducing the input voltage of said electrical environmental conditions by a predetermined amount;
    converting said electrical environmental conditions to a digital form;
    temporarily recording said electrical environmental conditions on a first recording means;
    simultaneous with said temporary recording step comparing said digital signals in a microprocessor means against predetermined signal limits stored in a memory to determine when said electrical environmental conditions exceed said predetermined limits; and,
    automatically transferring the information temporarily stored on said first recording means to a relatively permanent second recording means when said electrical environmental conditions exceed said predetermined limits so that said second recording means includes a selective record of all electrical environmental conditions which exceed said predetermined limits wherein said second recording means only records from said first recording means beginning at a predetermined voltage level and ending at the same predetermined voltage level so that the electrical environmental conditions recorded by said second recording means have substantially continuous beginning and ending transitions.

11. The method of claim 10 wherein said reproducing step includes the steps of:

preamplifying the output from said recording step; and, power amplifying the output from said preamplifying step so that the output from said power amplifying step is substantially identical to the original electrical envrionmental condition monitored during said recording step.

12. An enviroment recording apparatus for monitoring electrical envrionmental conditions including:

first recording means connected to said electrical environmental conditions for temporarily recording said electrical environmental conditions;

electrical environmental condition analyzing means for analyzing said electrical environmental conditions substantially at the same time as said first recording means is recording said electrical environmental conditions and for determining when said electrical environmental conditions exceed certain predetermined limits, said electrical environmental condition analyzing means including microprocessor means for automatically processing signals representative of said electrical environmental conditions and memory means connected to said microprocessor means for storing said predetermined limits; and, second recording means connected to said first recording means and to said electrical environmental condition analyzing means for automatically, selectively and permanently recording from said first recording means those electrical conditions which exceed said predetermined limits, wherein said second recording means only records from said first recording means beginning at a predetermined voltage level and ending at the same predetermined voltage level so that the electrical environmental conditions recorded by said second recording means have substantially continuous beginning and ending transitions.

13. The apparatus of claim 12 wherein said analyzing means further includes:

analog-to-digital converter means for converting said electrical environmental conditions from analog into digital signals and transmitting said signals to said microprocessor means; and, zero crossover detector means connected to said microprocessor means for detecting when said electrical environmental conditions pass through a zero voltage level.

14. The apparatus of claim 13 further comprising:

input means connected to said analyzing means for reducing the input voltage of said electrical environmental conditions.

15. The apparatus of claim 14 further comprising:

device drive means connected to said microprocessor means; and, switch means connected to said device drive means for causing said second recording means to selectively record from said first recording means.

16. The apparatus of claim 15 further comprising:

output amplifier means connected between said second recording means and the output of said environment recording apparatus; and, amplifier gain adjust means connected to said device drive means for adjusting the gain of said output amplifier.

17. The apparatus of claim 16 further comprising:

fault detecting means for monitoring said electrical device to determine when said electrical device fails; and, means for transferring the fault causing electrical environmental condition from said second recording means to said first recording means when said first detecting means detects said fault.

18. The system of claim 17 wherein said environment recording means further comprises:

header means for placing a standardized signal on said second recording means, wherein said microprocessor means controls said amplifier gain adjust means so that the signals played back from said second recording means are adjusted in amplitude to substantially duplicate the original electrical environmental conditions.

19. The apparatus of claim 12 further including:

amplifier means connectable between said environment recording apparatus and an electrical device to be tested for amplifying and transferring signals between said environment recording apparatus and said electrical device to be tested; and, feedback means connectable between said electrical device to be tested and said environment recording apparatus for signalling to said environment recording apparatus when said electrical device fails so that said failure event can be recorded by said environment recording apparatus in relation to the failure causing condition.

* * * * *